(12) United States Patent
Rexberg (10) Patent No.: US 7,924,942 B2
(45) Date of Patent: Apr. 12, 2011

(54) POWER AMPLIFIER PRE-DISTORTION

(75) Inventor: Leonard Rexberg, Hässelby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 788 days.

(21) Appl. No.: 10/560,346

(22) PCT Filed: Jun. 18, 2003

(86) PCT No.: PCT/SE03/01032
§ 371 (c)(1), (2), (4) Date: Jul. 25, 2006

(87) PCT Pub. No.: WO2004/112240
PCT Pub. Date: Dec. 23, 2004

(65) Prior Publication Data
US 2007/0063770 A1    Mar. 22, 2007

(51) Int. Cl.
*H04K 1/02* (2006.01)
*H04L 25/03* (2006.01)

(52) U.S. Cl. .................. 375/297; 375/296

(58) Field of Classification Search ............ 375/296, 375/299, 297, 295; 341/61, 143
See application file for complete search history.

(56) References Cited

U.S. PATENT DOCUMENTS

| | | | | |
|---|---|---|---|---|
| 4,816,914 A | * | 3/1989 | Ericsson | 375/240.03 |
| 5,832,022 A | * | 11/1998 | Scott | 375/142 |
| 5,867,065 A | | 2/1999 | Leyendecker | |
| 6,141,390 A | | 10/2000 | Cova | |
| 6,356,146 B1 | | 3/2002 | Wright et al. | |

(Continued)

FOREIGN PATENT DOCUMENTS

GB    2376613 A    12/2002

OTHER PUBLICATIONS

Chen, Hsing-Hung et al, Joint Ploynomial and Look-up Table Power Amplifier Linearization Scheme, Mobile Communication Lab., Institute of Communications Engr., IEEE, 2003.*

(Continued)

*Primary Examiner* — Chieh M Fan
*Assistant Examiner* — Qutbuddin Ghulamali
(74) *Attorney, Agent, or Firm* — Nixon & Vanderhye P.C.

(57) ABSTRACT

A power amplifier pre-distorter is formed by a FIR filter structure which includes an individual look-up table for each filter tap, where each look-up table represents a sampled polynomial in a variable representing signal amplitude, and means for selecting, from each filter tap look-up table, a filter coefficient that depends on the amplitude of a corresponding complex signal value to be multiplied by the filter tap. A training method for such a pre-distorter determines (S1) a first estimate of a first look-up table assigned to a first filter tap, assuming a second look-up table assigned to a second filter tap is set to predetermined table values. Thereafter the method determines (S2) a second estimate of the second look-up table, assuming the first look-up table is set to the determined first estimate. If deemed necessary, the method includes the further steps (a) refining (S3) the first estimate refined, assuming the second look-up table is set to the latest determined second estimate, and (b) refining (S4) the second estimate, assuming the first look-up table is set to the latest determined first estimate. Steps (a) and (b) may be repeated (S5) until convergence is reached.

14 Claims, 6 Drawing Sheets

U.S. PATENT DOCUMENTS

| | | | |
|---|---|---|---|
| 6,404,823 B1 * | 6/2002 | Grange et al. | 375/297 |
| 6,614,854 B1 * | 9/2003 | Chow et al. | 375/297 |
| 7,269,231 B2 * | 9/2007 | Ding et al. | 375/296 |
| 7,397,850 B2 * | 7/2008 | Easley et al. | 375/240 |
| 2002/0008578 A1 * | 1/2002 | Wright et al. | 330/149 |
| 2003/0223508 A1 * | 12/2003 | Ding et al. | 375/296 |

OTHER PUBLICATIONS

International Search Report of PCT/SE2003/001032, mailed Feb. 10, 2004.

Lei Ding et al., "A Robust Digital Baseband Predistorter Constructed Using Memory Polynomials", IEEE Trans. On Communication, Mar. 16, 2002, pp. 1-23.

J. Kim et al., "Digital predistortion of wideband signals based on power amplifier model with memory", Electronics Letters, Nov. 8, 2001, vol. 37, No. 23, pp. 1417-1418.

James K. Cavers, "Amplifier Linearization Using a Digital Predistorter with Fast Adaptation and Low Memory Requirements", IEEE Transactions on Vehicular Technology, Nov. 1990, vol. 39, No. 4, pp. 374-382.

* cited by examiner

POWER AMPLIFIER PRE-DISTORTION

This application is the US national phase of international application PCT/SE2003/001032 filed 18 Jun. 2003 which designated the U.S., the entire content of which is hereby incorporated by reference.

TECHNICAL FIELD

The technical disclosure relates to digital pre-distortion in power amplifiers with memory effects.

BACKGROUND

Power amplifiers are known to add more or less distortion to the signal they are designed to amplify. The reason for this is that a power amplifier has a non-linear input-output signal characteristic. This shows up as a broadened spectrum around the desired amplified, signal, and as an unwanted inband component of the signal. As a counter-measure to decrease the effects of non-linearity, it is known to pre-distort the signal at the input of the amplifier as to give an un-distorted amplified signal at the output of the amplifier. This technique is called pre-distortion. Pre-distortion as implemented today normally uses a look-up table that is used to multiply the signal. The entry into the table is the magnitude of the signal at every time sample.

Memory effects is another problem related to power amplifiers. Memory effects typically show up as a non-symmetrical spectrum around the carrier at the output of a power amplifier. That is, although the carrier (desired signal) spectrum is perfectly symmetrical, the spurious spectrum coming from the distortion may be non-symmetrical with respect to the center of the carrier.

The methods commonly used to handle non-linearity do not in general take into account memory effects of the power amplifier. As the term "memory effects" indicates, there is a dependence not only on the present sample but also on delayed samples of the signal. Thus, a single table approach cannot take care of memory effects, but can only handle non-linearity.

Lei Ding et. al. [1] inspired by work by Kim and Konstantinou [2] have derived a pre-distortion method based on what they call "Memory Polynomials" that very well model memory effects. However, a drawback of this method is that it requires recalculation of the memory polynomials for each new input signal amplitude, which can be computationally costly, especially if many polynomials of high order are used. A further drawback of this method is the computationally costly training procedure used to determine the polynomial coefficients.

SUMMARY

An object of the present invention is to provide a computationally efficient training method for pre-distortion based on memory polynomials.

Briefly, one or more aspects the present invention are based on a FIR filter structure including individual look-up tables for the filter taps, where each look-up table represents a discretized memory polynomial. Assuming two look-up tables, the training method is based on the observation that the look-up table that compensates for memory effects typically has much smaller elements than the look-up table that compensates for non-linearities. This makes it possible to easily determine a first approximation of this dominating look-up table by simply neglecting the other table. This approximation can in turn be used to determine a first approximation of the table compensating for the memory. This procedure can then be iterated by using the latest approximation of one table for determining a refined approximation of the other table until convergence is reached. An advantage of this method is that in each step only a single table has to be determined (the other table is assumed to be constant), which is a much simpler process than to determine both tables simultaneously in a single step.

BRIEF DESCRIPTION OF THE DRAWINGS

The aspect(s) of the invention, together with further objects and advantages thereof, may best be understood by making reference to the following description taken together with the accompanying drawings, in which.

DETAILED DESCRIPTION

In the following description the same reference designations will be used for the same or similar elements throughout the figures of the drawings.

Before the invention is described in detail, a brief description of the underlying problem will be given below.

Figure 1:
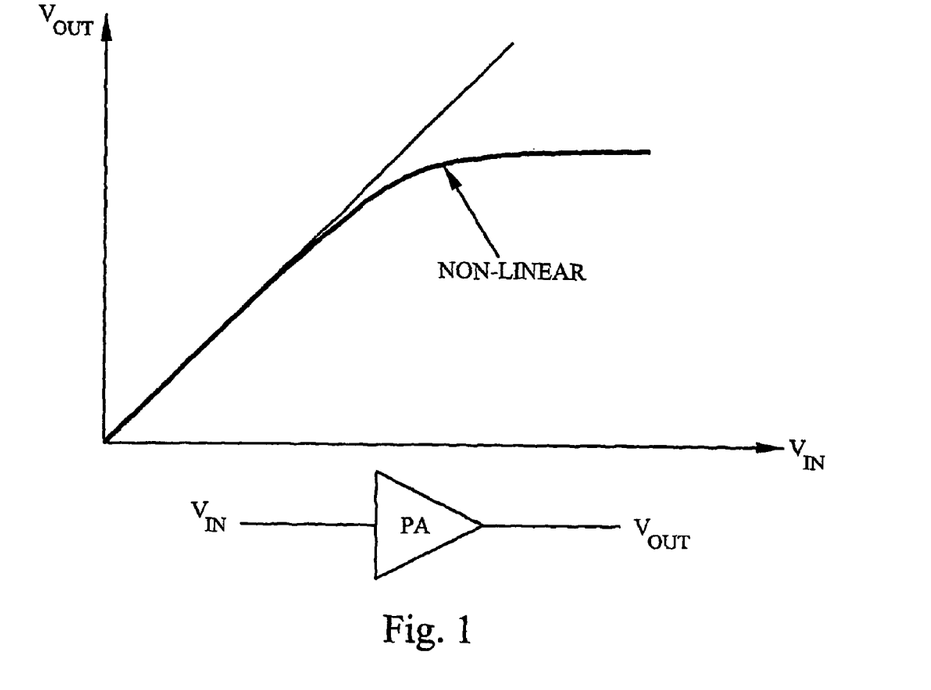
FIG. 1 is a diagram illustrating the non-linear input-output signal characteristic of a power amplifier.
Figure 2:
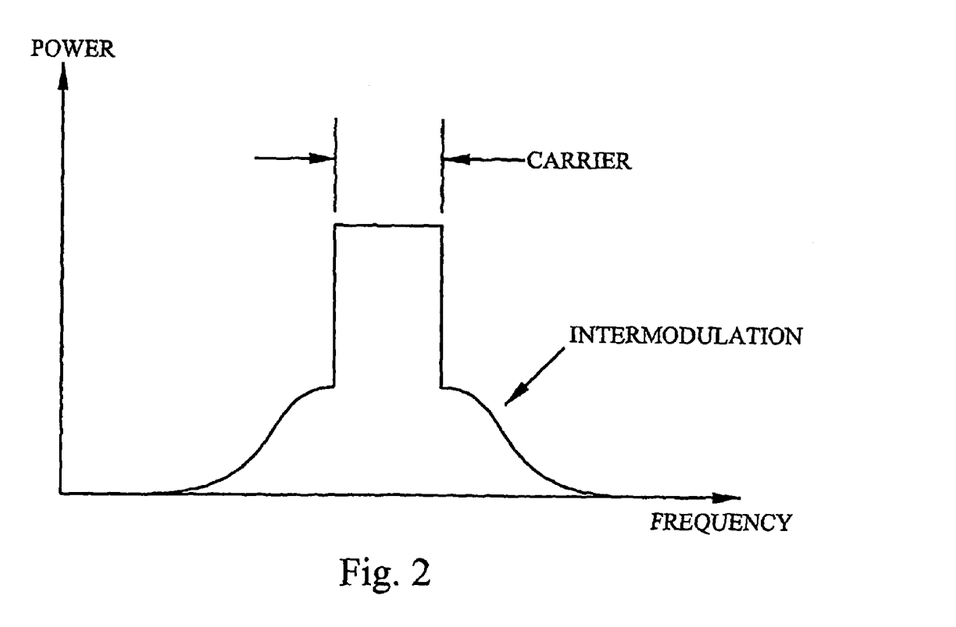
FIG. 2 is a diagram illustrating the spectrum of the signal amplified by a non-linear power amplifier.
Figure 3:
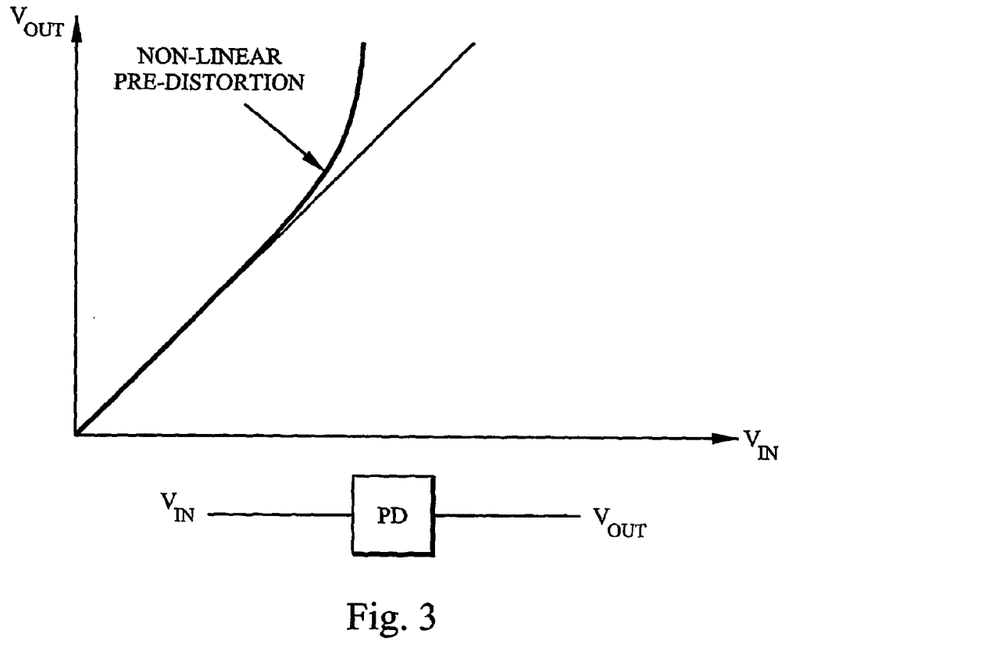
FIG. 3 is a diagram illustrating the input-output signal characteristic of a power amplifier pre-distorter for removing the non-linearity in FIG. 1.
Figure 4:
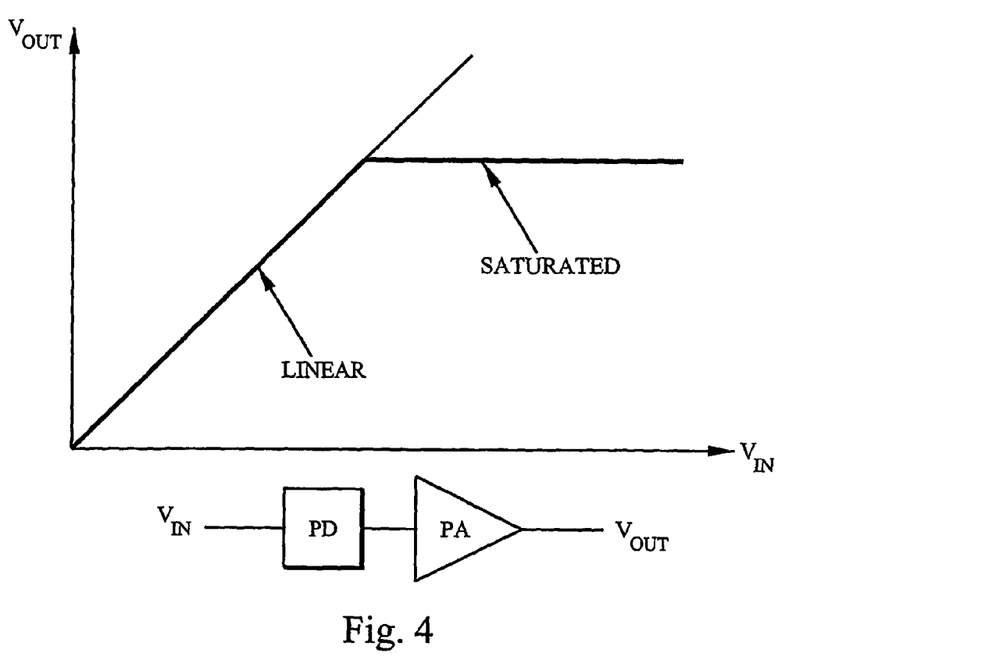
FIG. 4 is a diagram illustrating the input-output signal characteristic of a power amplifier provided with pre-distortion.

FIG. 1 illustrates the non-linear input-output signal characteristic of a power amplifier. At low input signal amplitudes the amplifier is almost linear, but at higher amplitudes it becomes more and more non-linear until it is saturated. This non-linearity shows up as a broadened spectrum around the desired amplified signal (and as an unwanted inband component of the signal), as illustrated in FIG. 2. As a counter-measure to decrease the effects of non-linearity, it is known to pre-distort the signal at the input of the amplifier to give an un-distorted amplified signal at the output of the amplifier. This technique is called pre-distortion and is illustrated in FIG. 3. The input-output signal characteristic for a pre-distorted power amplifier is essentially linear up to saturation, as illustrated in FIG. 4.

Figure 5:
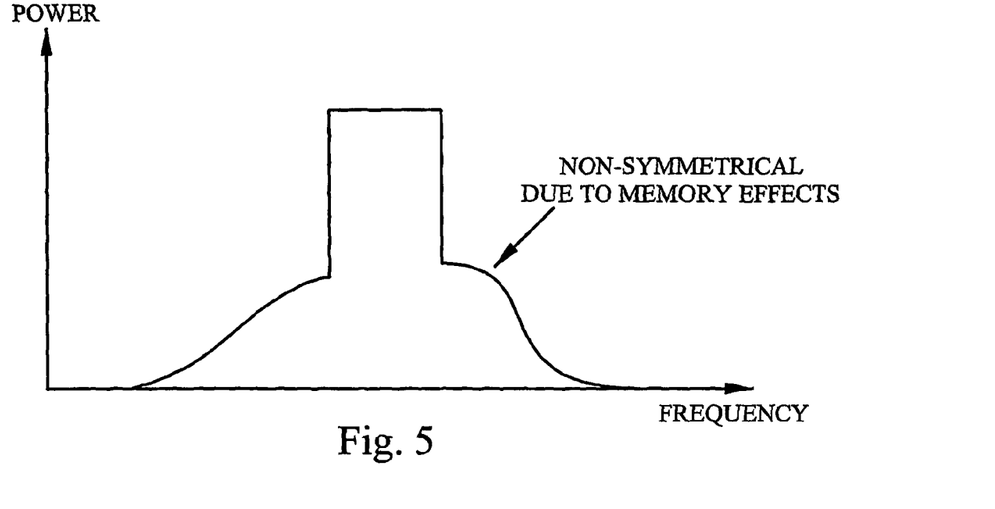
FIG. 5 is a diagram illustrating the spectrum of the signal amplified by a non-linear power amplifier with memory.

Memory effects is another problem related to power amplifiers. Memory effects typically show up as a non-symmetrical spectrum around the carrier at the output of a power amplifier, as illustrated in FIG. 5. That is, although the carrier (desired signal) spectrum is perfectly symmetrical, the spurious spectrum coming from the distortion may be non-symmetrical with respect to the center of the carrier.

There is a theoretical way of designing a pre-distorter that takes care of all memory effects. This is called the Volterra series. The Volterra series is an extension to the well-known Taylor series, which can be used as a pre-distorter for memory-less amplifiers. The Volterra series, however, also takes into account time-delayed terms that may quite accurately model the pre-distortion, and may therefore be used to suppress the distortion spectrum. However, a Volterra series quite rapidly gets large in terms of the number of possible terms in the expansion. For example, a polynomial of degree 5 with a memory depth (maximum delay) of 5 sample units will give rise to at least 500 coefficients.

Since the full Volterra series can not be implemented with reasonable complexity, an approximation based on "Memory Polynomials" has been suggested in [1]. In this approximation the pre-distortion PD(n) may be expressed as:

$$PD(n) = \sum_{k=1}^{K} \sum_{q=0}^{Q} a_{kq} x(n-q)|x(n-q)|^{k-1} \quad (1)$$

Unfortunately this expression is still quite complicated, and a drawback of this prior art method is that the expression has to be evaluated for each new input sample x(n). However, as will be shown below, this expression may be rewritten into a more suitable form for practical implementation. The derivation essentially includes three steps:

1. Separate the double sum into partial sums including only terms with the same delay. This gives:

$$\text{Separate delays into different sums} \begin{cases} PD(n) = \sum_{k=1}^{K} \sum_{q=0}^{Q} a_{kq} x(n-q)|x(n-q)|^{k-1} = \\ = \sum_{k=1}^{K} a_{k0} x(n)|x(n)|^{k-1} + \\ + \sum_{k=1}^{K} a_{k1} x(n-1)|x(n-1)|^{k-1} + \\ \vdots \\ + \sum_{k=1}^{K} a_{kQ} x(n-Q)|x(n-Q)|^{k-1} \end{cases}$$

2. Here it is noted that the delayed signals x(n−q) do not depend on the summation indices k. Thus the partial sums may be factorized into:

$$\text{Factorize } k \text{ and } q \text{ dependence in each sum} \begin{cases} = x(n) \underbrace{\sum_{k=1}^{K} a_{k0} |x(n)|^{k-1}}_{T_0(|x(n)|)} + \\ + x(n-1) \underbrace{\sum_{k=1}^{K} a_{k1} |x(n-1)|^{k-1}}_{T_1(|x(n-1)|)} + \\ \vdots \\ + x(n-Q) \underbrace{\sum_{k=1}^{K} a_{kQ} |x(n-Q)|^{k-1}}_{T_Q(|x(n-Q)|)} + \end{cases}$$

3. Identify the polynomials $T_q(|x(n-q)|)$ to obtain:

$$PD(n) = \sum_{q=0}^{Q} x(n-q) T_q(|x(n-q)|) \quad (2)$$

Figure 6:
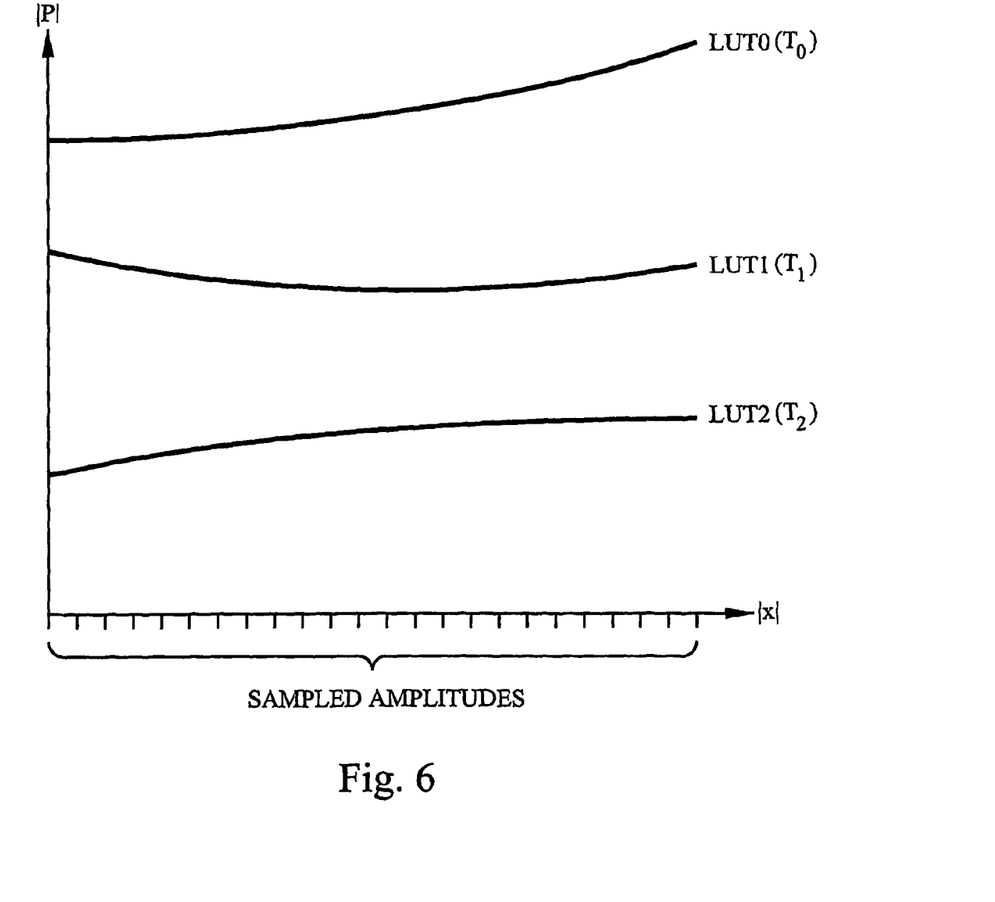
FIG. 6 is a diagram illustrating discretization of polynomials in accordance with an embodiment of the present invention.
Figure 7:
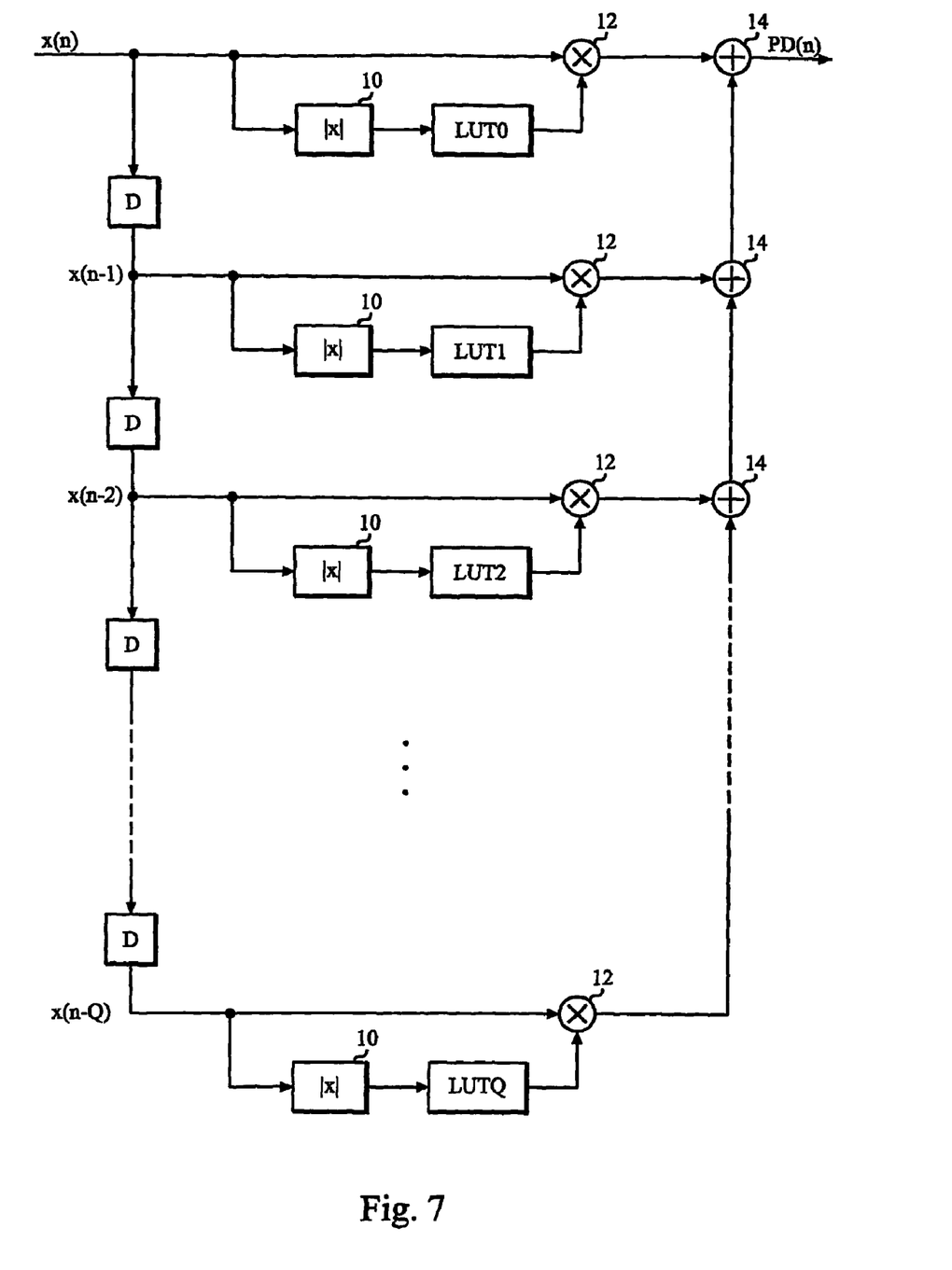
FIG. 7 is a block diagram of an example embodiment of a pre-distorter suitable to be trained in accordance with the present invention.

It is noted in (2) that $T_q(|x(n-q)|)$ are polynomials in the absolute value of the (complex) variable x(n−q). Thus, by multiplying each delayed complex sample x(n−q) by a polynomial in |x(n−q)| (which has the same delay q) and summing up the products for all delays q, the same end result P(n) as in [3] will be obtained. However, this new approach has the advantage that the polynomials $T_q$ may be sampled at appropriate values of |x(n−q)|, as illustrated in FIG. 6, and stored in look-up tables. This will reduce the pre-distorter to a simple FIR filter structure, in which the normally constant filter coefficients are replaced by these look-up tables, as illustrated in FIG. 7. The problem addressed by the present invention is to determine the values of the polynomials $T_q$ at the sampling points in FIG. 6.

In the example embodiment illustrated in FIG. 7, the complex input signal x(n) is forwarded to an absolute value block 10 and to a multiplier 12. The absolute value signal from block 10 is forwarded to a look-up table LUT0 representing a sampled version of polynomial $T_0$. The corresponding (generally complex) value from look-up table LUT0 is forwarded to multiplier 12, where it multiplies the input signal sample x(n). Input signal x(n) is also forwarded to a delay block D, where it is delayed one or several sample periods for forming a delayed sample x(n−1). This delayed sample is processed in the same way as the non-delayed sample by an absolute value block 10, a multiplier 12 and a look-up table LUT1. However, look-up table LUT1 now represents a sampled version of polynomial $T_1$ instead of $T_0$. As illustrated in FIG. 7, further delays and look-up tables may be included. Finally, the obtained products are added to each other in adders 14 to form the pre-distorted signal PD(n). Look-up tables make computation in real time much more efficient than the polynomial computation for each sample of the input signal used in [1]. The look-up tables may be updated (by using the training method described below) to keep track of slow changes in the characteristics of the power amplifier.

Figure 8:
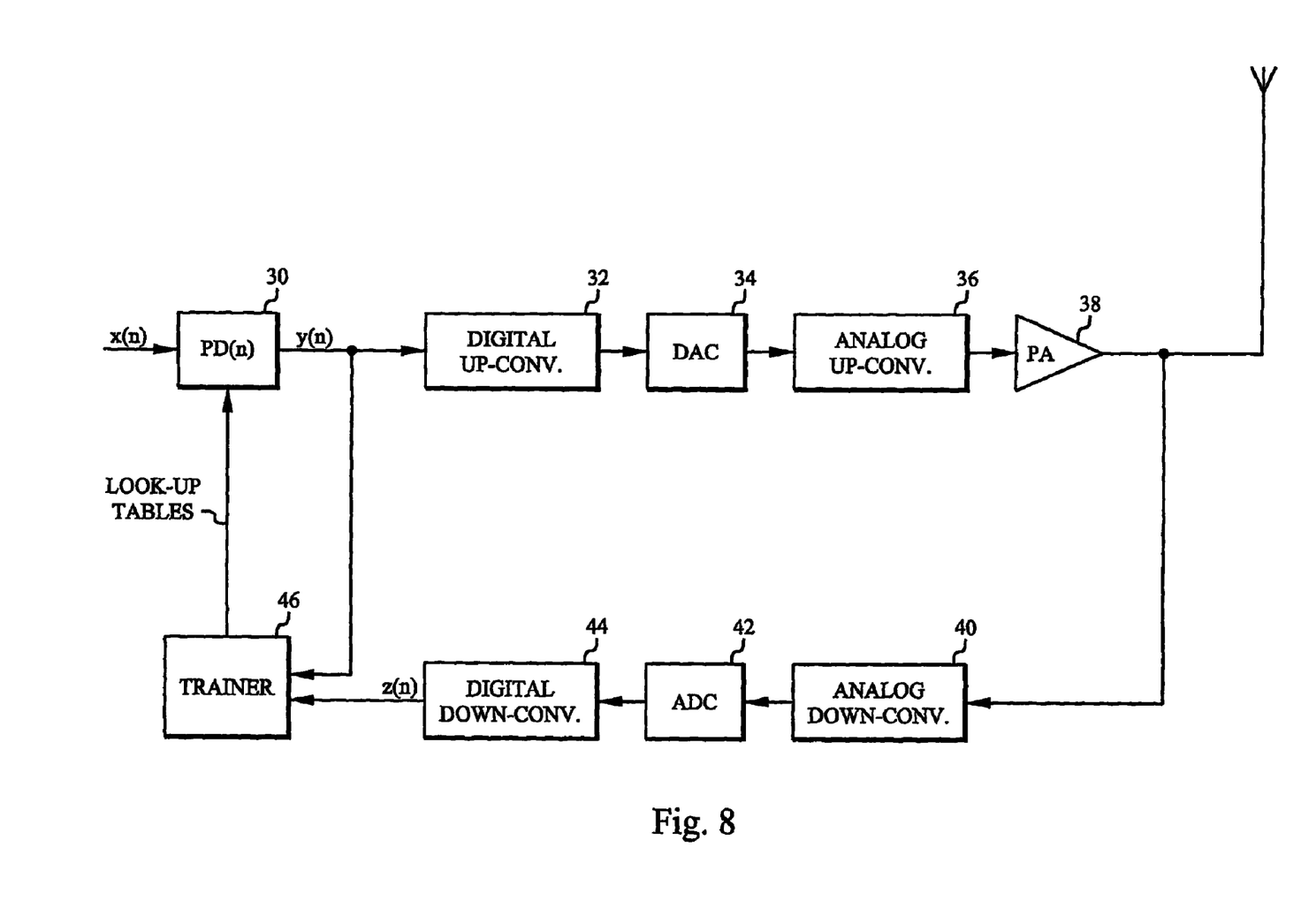
FIG. 8 is a block diagram of an exemplary embodiment of a base station including a power amplifier provided with a pre-distorter in accordance with FIG. 7.

FIG. 8 is a block diagram of an example embodiment of a base station including a power amplifier provided with a pre-distorter. In FIG. 8 elements that are not necessary for understanding have been omitted. The baseband complex signal x(n) is forwarded to a pre-distorter 30 in accordance with the present invention. The pre-distorted signal y(n) is up-converted to intermediate frequency (IF) in a digital up-converter 32 and converted into an analog signal in a D/A converter 34, which in turn is up-converted to radio frequency (RF) by an analog up-converter 36. The RF signal is forwarded to a power amplifier 38, and the amplified signal is forwarded to an antenna. The amplified RF signal is also forwarded to a feedback down-conversion chain including an analog down-converter 40, an A/D converter 42 and a digital down-converter 44. The down-converted feedback signal z(n) is forwarded to a trainer 46, which also receives the pre-distorted input signal y(n) for determining the look-up tables in pre-distorter 30 in accordance with the mathematical principles described below.

The described look-up table based pre-distorter may be implemented as an FPGA (Field Programmable Gate Array). Another possibility is to use a micro processor or a micro/signal processor combination and corresponding software.

The actual computation of the look-up table entries may be done in an off-line manner at a slow update speed, as described below.

The training method performed by trainer 46 in FIG. 8 will now be described in more detail. In order to illustrate the training process, a pre-distorter 30 including two look-up tables $T_0$ and $T_1$ (corresponding to LUT0 and LUT1 in FIG. 7, with a one sample delay as an example) will be assumed. With this assumption equation (2) becomes:

$$y(n)=x(n)\cdot T_0(|x(n)|)+x(n-1)\cdot T_1(|x(n-1)|) \qquad (3)$$

A training procedure may be implemented by noting that $z(n)$ should be equal to $y(n)$ if the distorting action of the power amplifier is undone, i.e. if the same pre-distortion is applied to $z(n)$. Thus, the following equation may be used as a basis for a training procedure for determining the look-up tables $T_0$ and $T_1$:

$$z(n)\cdot T_0(|z(n)|)+z(n-1)\cdot T_1(|z(n-1)|)=y(n) \qquad (4)$$

The training procedure is based on measuring a large batch of signal pairs $$(y(i),z(i)), i=1,\ldots,N$$

where N is the number of signal pairs in the batch (depending on the required accuracy, the number of table entries etc, N is typically between 2000 and 50 000). Since the samples in the batch should fulfill equation (4), one obtains a system of equations. Using traditional methods to solve such a system of equations involves approximating the look-up tables by polynomials in $|z(n)|$ and $|z(n-1)|$, respectively, and solving the resulting approximate equations by the method of least mean squares by solving the so called normal equations [1]. This method, however, involves rather extensive numerical computations, especially since complex numbers and complex matrix inversions are involved in the process.

Rather, a simpler method is suggested for determining look-up tables from equation (4). This method is based on the observation that table $T_1$, which takes care of memory effects, typically has elements that are at least an order of magnitude smaller than the elements of table $T_0$. Thus, as a first approximation equation (4) may be written as:

$$z(n)T_0(|z(n)|)=y(n) \qquad (5)$$

This equation is much easier to solve. Since equation (5) has the same form as a simple pre-distorter without memory effect compensation, any method used for determining the look-up table of such a pre-distorter may be used to solve it. One such method may, for example, be found by dividing the range of $|z(n)|$ into intervals, and then solve equation (5) for each amplitude level. Since there is a multitude of data for each amplitude level, one might compute the average of all the data belonging to each amplitude level k to obtain a first approximation $T_0^{(1)}$ of $T_0$ in accordance with the formula:

$$T_0^{(1)}(k) = \frac{1}{N_k}\cdot \sum_{i=[index]} \frac{y(i)}{z(i)} \qquad (6)$$

where the vector "[index]" includes the indices of the signal samples in the measured batch that lie in the interval that corresponds to table index k and $N_k$ represents the number of components of this vector. A standard search algorithm (not described here) may be used for this purpose. Another method of determining table $T_0$ from equation (5) is described in [3].

Once the first approximation $T_0^{(1)}$ has been found, this approximation may be used in equation (4) to determine a first approximation of $T_1$. Moving the first term to the right hand side gives:

$$z(n-1)\cdot T_1(|z(n-1)|)=y(n)-z(n)\cdot T_0^{(1)}(|z(n)|)=w(n-1) \qquad (7)$$

Since the index name n is arbitrary (it does not matter whether it is called n or n−1), it is noted that equation (7) has the same form as equation (5). This fact may be used to find a first approximation $T_1^{(1)}$ of $T_1$ by using the same method as for $T_0$. Thus, $T_1^{(1)}$ may, for example, be determined as the average:

$$T_1^{(1)}(k) = \frac{1}{N_k}\cdot \sum_{i=[index]} \frac{w(i)}{z(i)} \qquad (8)$$

In a simple form, the approximations $T_0^{(1)}$ and $T_1^{(1)}$ may be used directly as the output of the training procedure. However, further refinements may be achieved by repeating the "trick" in equation (7) one or several times. Thus, to obtain a second approximation $T_0^{(2)}$ of $T_0$, the first approximation $T_1^{(1)}$ of $T_1$ is inserted into equation (4). Once again an equation having the same form as equation (5) is obtained. This equation may be solved approximately using, for example, the averaging method described above. A second approximation $T_1^{(2)}$ of $T_1$ may be obtained in a similar way. This process may be repeated to obtain approximations of higher orders until convergence is reached (i.e. until there are only insignificant changes to the approximations from one iteration to the next). Depending on the required accuracy, convergence is usually obtained after 3-5 iterations. However, if the accuracy requirements are relaxed, acceptable tables may even be obtained after the first or second iteration.

Thus, by solving equation (4) iteratively as described above, the training problem has been reduced to repeatedly solving equations having the same form as equation (5), which is only a single table problem. It is stressed that any method suitable for solving such a single table problem may be used to find the successive approximations of $T_0$ and $T_1$.

Equation (4) is valid both for a first time training and for updating the look-up tables. The method described above assumed that the tables had not been determined yet. For this reason $T_1$ was initially set to 0. However, if the tables are updated, the current table $T_1$ may be used as an initial guess instead, since it is probably closer to the correct table.

Another variation of the method described above is to reverse the roles of tables $T_0$ and $T_1$ by initially setting all elements of table $T_0$ to 1 (instead of setting the elements of $T_1$ to 0) and determine $T_1^{(1)}$ before $T_0^{(1)}$. A similar approach for updating the tables uses the current table $T_0$ as an initial guess instead of the current table $T_1$.

Figure 9:
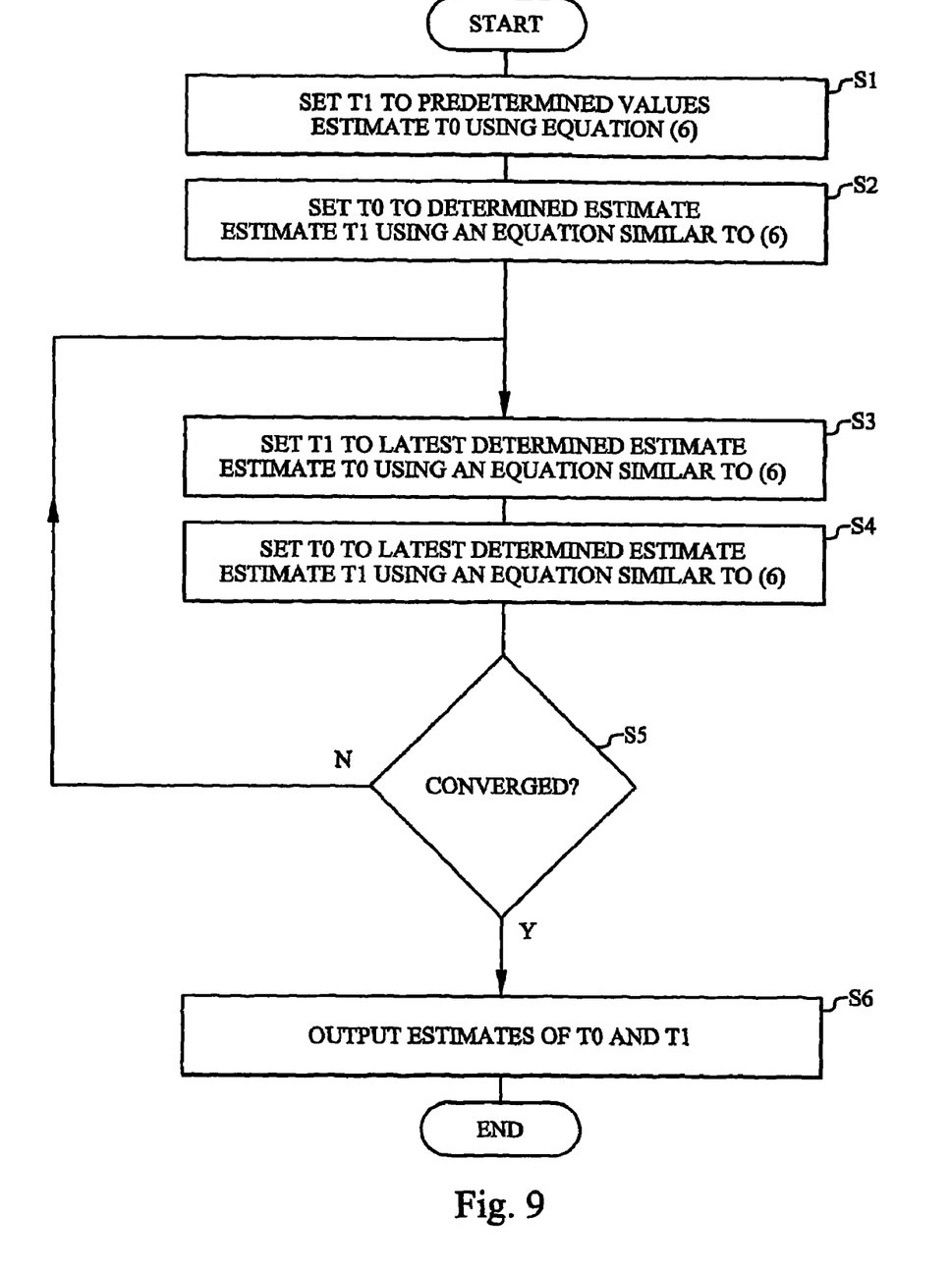
FIG. 9 is a flow chart illustrating an example embodiment of the training method in accordance with the present invention.

FIG. 9 is a flow chart illustrating an example embodiment of the training method. Step S1 sets the elements of table $T_1$ to predetermined values, typically 0 for a first time training and the current $T_1$ values for an update. Then $T_0$ is estimated by solving equation (6). Step S2 sets $T_0$ the determined estimate in equation (4) for obtaining an equation having the same form as equation (5), This equation is solved for an estimate of $T_1$. If simplicity is more important than accuracy, it is possible to stop here and output the obtained estimates as the final tables. However, preferably a few more iterations (steps S3-S5) are performed. Step S3 sets $T_1$ to the latest determined estimate of $T_1$. Then the estimate of $T_0$ is refined by solving an equation similar to equation (5). Step S4 sets $T_0$ the latest determined estimate of $T_0$. Then the estimate of $T_1$ is refined by solving an equation similar to equation (5). (Another simple embodiment may be obtained by stopping after step S3. This embodiment involves two iterations for $T_0$, but only one iteration for $T_1$. This embodiment may, for example, suffice for an update, since a rather good estimate is already available for $T_1$ in this case.) Step S5 tests whether the tables have converged. This can be done, for example, by summing the absolute values (or squares) of the differences between corresponding elements of the current estimates and the previous estimates and testing whether the obtained sum is smaller than a predetermined threshold. If the tables have converged, the current estimates are provided as the final tables in step S6. If the tables have not converged, steps S3-S5 are repeated. Typically this method is implemented by a micro processor or a micro/signal processor combination and corresponding software.

The outlined iterative method of successively improving table accuracy may be extended to include more tables. For example, a third table, which takes into account memory effects of another time delay, may be included in the same manner as in the two-table solution. The iteration may be outlined as follows: Perform the iteration scheme as outlined above until convergence is reached for tables $T_0$ and $T_1$. Then add a third table $T_2$ corresponding to another time delay and determine an estimate of this table using the equation:

$$z(n-2) \cdot T_2(|z(n-2)|) = y(n) - z(n) \cdot T_0(|z(n)|) - z(n-1) \cdot T_1(|z(n-1)|) - v(n-2)$$

which again has the same form as equation (5). Further iterations may now be performed using estimates of two tables to determine a refined estimate of the third table until convergence is reached. A variation of this scheme is to estimate the third table as soon as the first estimates of the two other tables have been obtained. The described extension gives best results if the third table has elements with significantly smaller magnitudes than the second table.

The advantages are at least three-fold: Firstly, already implemented single-table algorithms may be used for both the first table and the second memory table (and possibly further tables). Secondly, an iterative method may be used which usually is very attractive to implement in software due to its simple structure. Thirdly, exhausting computations involving inversion of complex-valued matrices and matrix-matrix multiplications as in the method of Least Mean Squares can be avoided entirely. The present disclosure makes it possible to implement multi-table calculations in processors of the same size as used for single-tables. The execution time will only be slightly longer than for a single-table. Usually only a few loops in the iteration scheme will be necessary to obtain the same convergence as the Least-mean Squares algorithm.

It will be understood by those skilled in the art that various modifications and changes may be made to the present invention without departure from the scope thereof, which is defined by the appended claims.

The invention claimed is:

1. A training method for a power amplifier pre-distorter formed by a FIR filter structure, wherein the FIR filter structure includes an individual look-up table for each filter tap, the method comprising:
    selecting, from each filter tap of the individual look-up table, a filter coefficient that depends on an amplitude of a corresponding complex signal value to be multiplied by the filter tap;
    determining a first estimate of a first look-up table assigned to a first filter tap, assuming a second look-up table assigned to a second filter tap is set to predetermined table values; and
    determining a second estimate of the second look-up table assuming the first look-up table is set to the determined first estimate,
    wherein each look-up table represents a discretized polynomial in a variable representing the signal amplitude of an input signal to the FIR filter structure, and
    wherein the filter coefficient selected from the look-up table corresponding to each filter tap is independent of complex signal values to be multiplied by other filter taps.

2. The method of claim 1, further comprising refining the first estimate, assuming the second look-up table is set to a latest determined second estimate.

3. The method of claim 2, wherein the steps of determining the first estimate, determining the second estimate, and refining the first estimate involve solving equations having a same algebraic form.

4. The method of claim 1, further comprising:
    (a) refining the first estimate, assuming the second look-up table is set to the latest determined second estimate; and
    (b) refining the second estimate, assuming the first look-up table is set to a latest determined first estimate.

5. The method of claim 4, wherein the steps (a) and (b) are repeated until the first and second estimates have converged.

6. The method of claim 5, wherein the steps of determining the first estimate, determining the second estimate, refining the first estimate, and refining the second estimate involve solving equations having a same algebraic form.

7. The method of claim 4, wherein the steps of determining the first estimate, determining the second estimate, refining the first estimate, and refining the second estimate involve solving equations having a same algebraic form.

8. A base station including a power amplifier pre-distorter formed by a FIR filter structure including:
    an individual look-up table for each filter tap, each of the individual look-up table representing a discretized polynomial in a variable representing signal amplitude of an input signal to the FIR filter structure; and
    means for selecting, from each filter tap look-up table, a filter coefficient that depends on the amplitude of a corresponding complex signal value to be multiplied by the filter tap,
    wherein the filter coefficient selected from the look-up table corresponding to each filter tap is independent of complex signal values to be multiplied by other filter taps, and
    wherein said base station further includes a pre-distorter trainer including:
    means for determining a first estimate of a first look-up table assigned to a first filter tap, assuming a second look-up table assigned to a second filter tap is set to predetermined table values; and
    means for determining a second estimate of the second look-up table, assuming the first look-up table is set to the determined first estimate.

9. The base station of claim 8, wherein said trainer includes means for refining the first estimate, assuming the second look-up table is set to a latest determined second estimate.

10. The base station of claim 9, wherein said means for determining the first estimate, said means for determining the second estimate, and said means for refining the first estimate all use solving equations having a same algebraic form.

11. The base station of claim 8, wherein said pre-distorter trainer further includes:

means for refining the first estimate, assuming the second look-up table is set to a latest determined second estimate; and means for refining the second estimate, assuming the first look-up table is set to the latest determined first estimate.

12. The base station of claim 11, wherein said means for refining the first estimate and said means for refining the second estimate repeat their respective refining until the first and second estimates have converged.

13. The base station of claim 12, wherein said means for determining the first estimate, said means for determining the second estimate, said means for refining the first estimate, and said means for refining the second estimate use solving equations having a same algebraic form.

14. The base station of claim 11, wherein said means for determining the first estimate, said means for determining the second estimate, said means for refining the first estimate, and said means for refining the second estimate use solving equations having a same algebraic form.

\* \* \* \* \*

UNITED STATES PATENT AND TRADEMARK OFFICE
CERTIFICATE OF CORRECTION

PATENT NO. : 7,924,942 B2
APPLICATION NO. : 10/560346
DATED : April 12, 2011
INVENTOR(S) : Rexberg It is certified that error appears in the above-identified patent and that said Letters Patent is hereby corrected as shown below:

On the Face Page, in Field (56), under "OTHER PUBLICATIONS", in Column 2, Line 1, delete "Ploynomial" and insert -- Polynomial --, therefor.

In Column 1, Line 19, delete "amplified," and insert -- amplified --, therefor.

In Column 3, Line 63, in Equation, delete " $Q)|^{k-1} +$ " and insert -- $Q)|^{k-1}$ --, therefor.

In Column 6, Line 58, delete "$T_0$" and insert -- $T_0$ to --, therefor.

In Column 6, Line 67, delete "the" and insert -- to the --, therefor.

Signed and Sealed this
Eighteenth Day of October, 2011

David J. Kappos
*Director of the United States Patent and Trademark Office*